(12) United States Patent
Hu

(10) Patent No.: US 11,309,252 B2
(45) Date of Patent: Apr. 19, 2022

(54) PACKAGE SUBSTRATE AND PACKAGE STRUCTURE

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 52 days.

(21) Appl. No.: 17/019,375

(22) Filed: Sep. 14, 2020

(65) Prior Publication Data

US 2020/0411442 A1 Dec. 31, 2020

Related U.S. Application Data

(63) Continuation-in-part of application No. 15/811,634, filed on Nov. 13, 2017, now Pat. No. 10,818,584.

(51) Int. Cl.
*H01L 23/538* (2006.01)
*H01L 23/00* (2006.01)

(52) U.S. Cl.
CPC ...... *H01L 23/5384* (2013.01); *H01L 23/5385* (2013.01); *H01L 23/5386* (2013.01); *H01L 24/06* (2013.01)

(58) Field of Classification Search
None
See application file for complete search history.

(56) References Cited

U.S. PATENT DOCUMENTS

| | | | | |
|---|---|---|---|---|
| 10,643,936 B2 * | 5/2020 | Hu | ...... | H01L 21/4857 |
| 2015/0102510 A1 * | 4/2015 | Kaneda | ...... | H05K 1/115 |
| | | | | 257/778 |
| 2015/0181703 A1 * | 6/2015 | Tanaka | ...... | H05K 1/0298 |
| | | | | 361/748 |
| 2015/0245473 A1 * | 8/2015 | Shimizu | ...... | H05K 1/036 |
| | | | | 257/778 |
| 2015/0282323 A1 * | 10/2015 | Shimizu | ...... | H01L 25/105 |
| | | | | 361/767 |

FOREIGN PATENT DOCUMENTS

JP 5662551 B1 * 1/2015 ........... H05K 1/0313

* cited by examiner

*Primary Examiner* — Julio J Maldonado
*Assistant Examiner* — Lawrence C Tynes, Jr.
(74) *Attorney, Agent, or Firm* — JCIPRNET

(57) ABSTRACT

A package substrate including a first redistribution structure, a first bonding layer, a core, a second bonding layer and a second redistribution structure in a sequential order is provided. The first redistribution structure has a first redistribution surface and a first bonding pad disposed on the first redistribution surface. The second redistribution structure has a second redistribution surface and a second bonding pad disposed on the second redistribution surface. The core has a first core pad disposed on a first core surface, and a second core pad disposed on a second core surface opposite to the first core surface. The first core pad and the second core pad are directly bonded to first bonding pad and the second bonding pad, respectively. The first core pad and the second core pad are offset from first bonding pad and the second bonding pad, respectively. The first bonding pad and the first core pad are embedded in the first bonding layer. The second bonding pad and the second core pad are embedded in the second bonding layer. A package structure is also provided.

19 Claims, 10 Drawing Sheets

PACKAGE SUBSTRATE AND PACKAGE STRUCTURE

CROSS-REFERENCE TO RELATED APPLICATION

This application is a continuation-in-part application of and claims priority benefit of U.S. application Ser. No. 15/811,634, filed on Nov. 13, 2017, now allowed. The entirety of the above-mentioned patent application is hereby incorporated by reference herein and made a part of this specification.

BACKGROUND OF THE INVENTION

1. Field of the Invention

The present invention relates to an electronic package technology, and more specifically relates to a package substrate and a package structure employing such the package substrate.

2. Description of Related Art

As the electronic industry has rapidly developed, the trend in electronic products has been to gradually move toward multi-functionality and high performance. One of the conventional structures of semiconductor packages has a semiconductor chip mounted on a package substrate which includes a core with symmetric built-up circuit structures.

In order to meet the demand for greater integration and miniaturization with higher densities of electronic components and wires, a package substrate with a finer interlayer connection is required to satisfy the operational requirements of integrated circuits with high circuit density. However, conventional types of package substrate using build-up circuit structures are not able to support such high-density wiring schemes. Therefore, fabricating a package substrate that has a high-density interconnection while keeping the manufacturing process simple has become a challenge to researchers in the field.

SUMMARY OF THE INVENTION

The invention provides a package substrate and a package structure having a reinforced high-density interconnection, thereby achieving a high quality of electrical signal transmission and low warpage with good mechanical stability.

The invention further provides a package substrate including a redistribution structure and a core. The redistribution structure has a first redistribution surface and a bonding pad disposed on the first redistribution surface. The core is disposed on the redistribution structure and has a first core surface facing towards the first redistribution surface of the redistribution structure. The core has a first core pad disposed on the first core surface and directly bonded to the bonding pad, and the first core pad is offset from the bonding pad.

The invention further provides a package structure including the aforementioned package substrate and a semiconductor chip. The semiconductor chip is disposed on the redistribution structure opposite to the core, wherein the semiconductor chip is electrically connected to the core through the redistribution structure.

The invention provides a package structure including a first redistribution structure, a second redistribution structure, a core, a first bonding layer and a second bonding layer. The first redistribution structure has a first redistribution surface and a first bonding pad disposed on the first redistribution surface. The second redistribution structure has a second redistribution surface and a second bonding pad disposed on the second redistribution surface. The core is disposed between the first redistribution structure and the second redistribution structure, has a first core surface facing towards the first redistribution surface of the first redistribution structure, has a first core pad disposed on the first core surface, has a second core surface opposite to the first core surface facing towards the second redistribution surface of the second redistribution structure, and has a second core pad disposed on the second core surface. The first bonding layer is disposed between the first redistribution structure and the core, and covers the first bonding pad and the first core pad. The second bonding layer is disposed between the second redistribution structure and the core, and covers the second bonding pad and the second core pad. A center of the first core pad is laterally offset from a center of the first bonding pad. A first portion of a planar surface of the first core pad is physically and directly contacting a planar surface of the first bonding pad. A second portion of the planar surface of the first core pad surrounding the first portion of the planar surface of the first core pad is non-bonded to the first bonding pad. The first bonding pad and the first core pad are embedded in the first bonding layer. A center of the second core pad is laterally offset from a center of the second bonding pad. A first portion of a planar surface of the second core pad is physically and directly contacting a planar surface of the second bonding pad. A second portion of the planar surface of the second core pad surrounding the first portion of the planar surface of the second core pad is non-bonded to the second bonding pad. The second bonding pad and the second core pad are embedded in the second bonding layer.

The invention further provides a package structure including the aforementioned package substrate and a semiconductor chip. The semiconductor chip is disposed on the second redistribution structure, wherein the semiconductor chip is electrically connected to the core through the second redistribution structure.

Based on the above, the package substrate includes the core pad of the core directly bonded to the corresponding bonding pad of the redistribution structure without the aid of foreign materials such as solders, thereby achieving a robust electronic package interconnection structure for high quality electrical signal transmission. In addition, the core pad of the core is offset from the corresponding bonding pad of the redistribution structure, thereby reducing the level of dimensional tolerance which is required during manufacture of the package substrate so as to reduce manufacturing efforts and costs.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
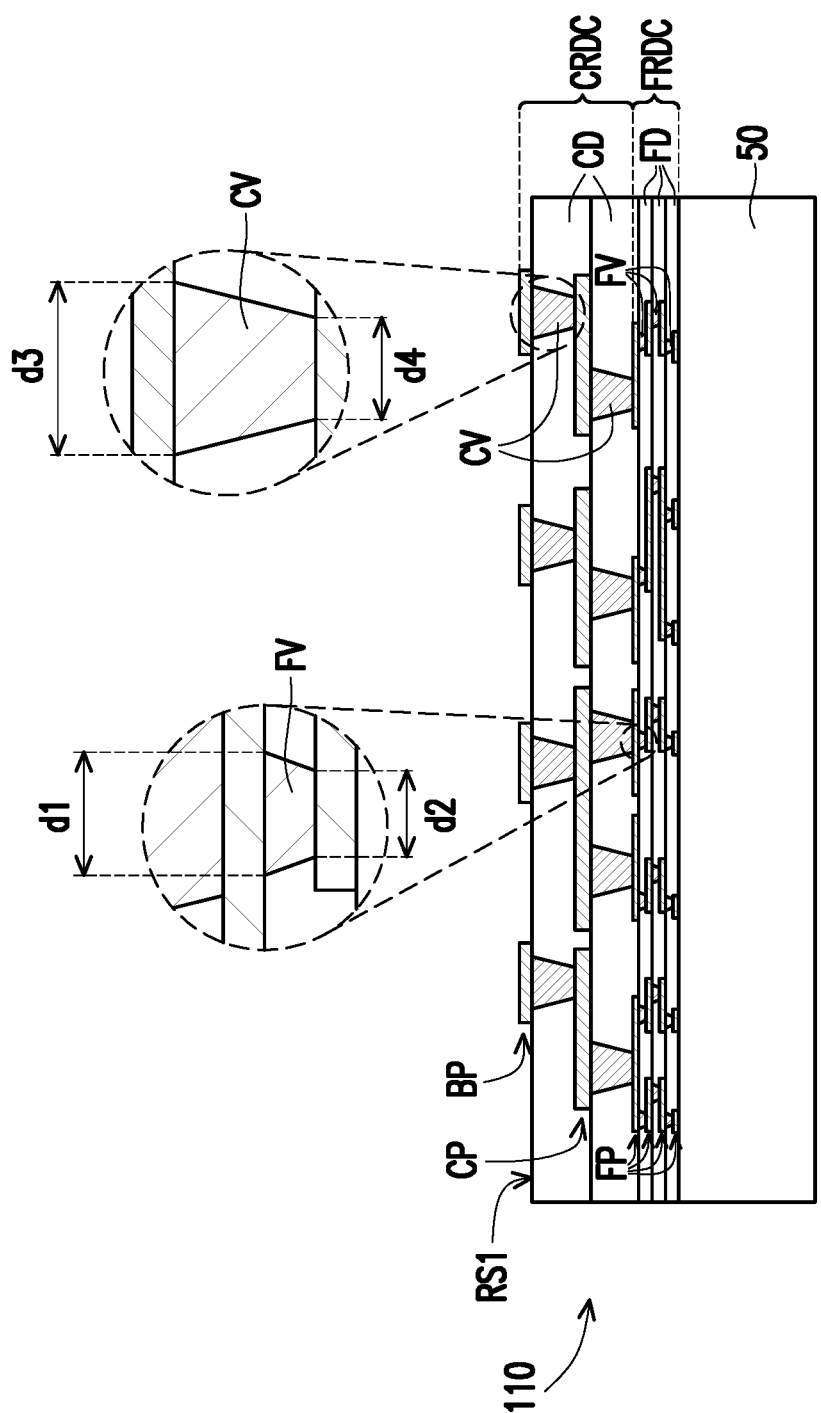
FIG. 1 is schematic cross-sectional views illustrating a redistribution structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is schematic cross-sectional views illustrating a redistribution structure according to an embodiment of the invention. Referring to FIG. 1, a redistribution structure 110 is provided. The redistribution structure 110 has a first redistribution surface RS1 and a bonding pad BP disposed on the first redistribution surface RS1. For example, the redistribution structure 110 includes a fine redistribution circuitry FRDC and a coarse redistribution circuitry CRDC disposed on the fine redistribution circuitry FRDC. A thickness of the fine redistribution circuitry FRDC may be less than a thickness of the coarse redistribution circuitry CRDC.

For example, the fine redistribution circuitry FRDC including a fine conductive pattern FP, a fine dielectric layer FD and a fine conductive via FV is formed on a temporary carrier 50. In some embodiments, the fine conductive pattern FP is stacked on the fine dielectric layer FD. The temporary carrier 50 may be made of glass, plastic or other suitable materials as long the material is able to withstand the subsequent processes while carrying a structure formed thereon. In some embodiments, a release layer (not shown) may be applied on a top surface of the temporary carrier 50 to enhance the releasibility of the fine redistribution circuitry FRDC from the temporary carrier 50 in a subsequent process.

For example, the fine conductive pattern FP may be formed on the temporary carrier 50 using a deposition process, a lithography process and an etching process, or other suitable processes. The fine conductive pattern FP may be a patterned conductive layer with fine line/space routing. Next, the fine dielectric layer FD including a plurality of openings may be formed over the temporary carrier 50 to cover the fine conductive pattern FP using, for example, a coating process, a photolithography and an etching process, or other suitable processes. The openings of the fine dielectric layer FD may expose at least the portion of the fine conductive pattern FP for electrical connection. A plurality of the fine conductive vias FV may be formed in the openings of the fine dielectric layer FD and the fine conductive patterns FP may be formed on the fine conductive vias FV in the same process. The fine conductive vias FV are electrically connected to the fine conductive patterns FP. The abovementioned steps may be performed multiple times such that the fine conductive patterns FP and the fine dielectric layers FD are alternatively stacked. In such embodiments, the fine conductive vias FV may be formed to connect between the fine conductive patterns FP in different layers to obtain a multi-layered redistribution circuitry as required by the circuit design. The topmost fine conductive pattern FP may be disposed on the fine dielectric layer FD for further electrical connection as shown in FIG. 1. In other words, the fine redistribution circuitry FRDC can be a stack of layers having fine line/space routing. In some embodiments, the fine dielectric layer FD may be formed before the fine conductive pattern FP. That is, there is no limitation in the present disclosure as to the forming sequence of the fine conductive pattern FP and the fine dielectric layer FD.

The coarse redistribution circuitry CRDC has the bonding pad BP and a coarse conductive pattern CP electrically connected to the fine conductive pattern FP. In some embodiments, the coarse redistribution circuitry CRDC includes a coarse dielectric layer CD and a coarse conductive via CV connected among the fine conductive pattern FP, the coarse conductive pattern CP and the bonding pad BP. For example, the coarse conductive pattern CP is stacked on the coarse dielectric layer CD. The coarse conductive via CV may be disposed in the coarse dielectric layer CD and disposed on the topmost layer of the fine conductive pattern FP. The coarse conductive pattern CP may be electrically connected to the fine conductive pattern FP through the coarse conductive via CV.

For example, the coarse dielectric layer CD including a plurality of openings may be formed over the topmost layer of the fine conductive pattern FP using a deposition process, a lithography process and an etching process, or other suitable processes. The openings of the coarse dielectric layer CD may expose at least the portion of the topmost layer of the fine conductive pattern FP for electrical connection. Next, a plurality of the coarse conductive via CV may be formed in the openings of the coarse dielectric layer CD to connect to the fine conductive pattern FP. The coarse conductive pattern CP may be formed on the coarse conductive via CV to electrically connect to the fine redistribution circuitry FRDC. For example, the coarse conductive pattern CP and the coarse conductive via CV may be formed in the same process. The coarse conductive pattern CP may be a patterned conductive layer with coarse line/space routing. In some embodiments, the coarse dielectric layer CD may be subsequently formed over the coarse conductive pattern CP and the openings of the coarse dielectric layer CD may expose at least the portion of the coarse conductive pattern CP to form the coarse conductive via CV. The abovementioned steps may be performed multiple times such that the coarse conductive patterns CP and the coarse dielectric layers CD are alternatively stacked. In such embodiments, the coarse conductive via CV may be formed to connect between the fine conductive pattern FP and the coarse conductive pattern CP and also between the coarse conductive patterns CP in different layers to obtain a multi-layered redistribution circuitry as shown in FIG. 1.

A dimension of the fine conductive pattern FP is less than a dimension of the coarse conductive pattern CP. For example, the line/space of the fine conductive pattern FP is finer than the line/space of the coarse conductive pattern CP.

In some embodiments, a thickness of the fine dielectric layer FD is less than a thickness of the coarse dielectric layer CD. In some embodiments, each of the fine conductive vias FV is tapered in a direction toward the temporary carrier 50. For example, an outer diameter d1 of one end of the fine conductive via FV facing towards the coarse redistribution circuitry CRDC is greater than an outer diameter d2 of another end of the fine conductive via FV facing away from the coarse redistribution circuitry CRDC. In some embodiments, each of the coarse conductive vias CV is tapered in a direction toward the fine redistribution circuitry FRDC. For example, an outer diameter d3 of one end of each coarse conductive via CV facing away from the fine redistribution circuitry FRDC is greater than an outer diameter d4 of another end of each coarse conductive via CV facing toward the fine redistribution circuitry FRDC. In some embodiments, each of the coarse conductive vias CV has a trapezoid shape with wide top and narrow bottom in a cross-sectional view. The size of each of the coarse conductive vias CV is greater than the size of each of the fine conductive vias FV.

Figure 2:
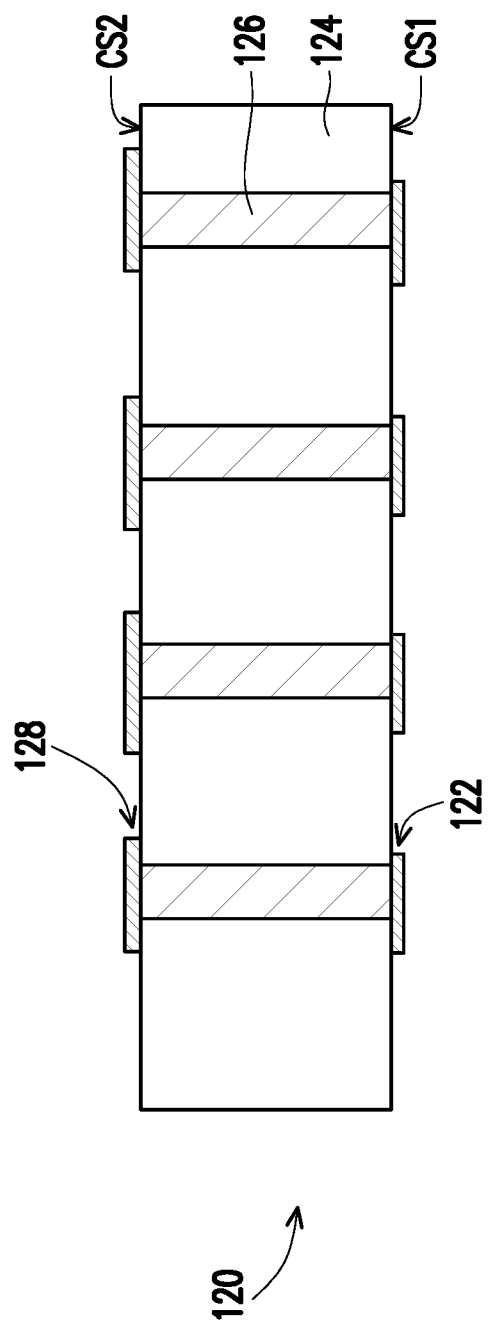
FIG. 2 is schematic cross-sectional views illustrating a core according to an embodiment of the invention.

FIG. 2 is schematic cross-sectional views illustrating a core according to an embodiment of the invention. Referring to FIG. 2, a core 120 is provided. The core 120 has a first core surface CS1 and a first core pad 122 disposed on the first core surface CS1. In some embodiments, the core 120 includes a core dielectric layer 124, a conductive through via 126 and a second core pad 128. For example, the first core pad 122 is disposed on the core dielectric layer 124. The conductive through via 126 (also known as a through hole) connected to the first core pad 128 may be through the core dielectric layer 124. The core 120 has a second core surface CS2 opposite to the first core surface CS1. The second core pad 128 may be disposed on the second core surface CS2 and connected to the conductive through via 126. That is, the first core pad 122 and the second core pad 128 are respectively disposed on the two opposite surfaces of the core dielectric layer 124 and electrically connected to each other through the conductive through via 126. In some embodiments, the core C may include materials such as polycarbonate (also known as PC), ceramic, metal, or other suitable materials.

A property of a material to consider is the stiffness of the material, which can be expressed as Young's Modulus. A Young's modulus of the core 120 may be greater than a Young's modulus of the redistribution structure 110. For example, the Young's modulus of the core dielectric layer 124 is greater than the Young's modulus of the coarse dielectric layer CD of the coarse redistribution circuitry CRDC and is also greater than the fine dielectric layer FD of the fine redistribution circuitry FRDC. In other words, the material of the core dielectric layer 124 is stiffer than the material of the coarse dielectric layer CD and the material of the fine dielectric layer FD.

In some embodiments, the thickness of the coarse dielectric layer CD is less than a thickness of the core dielectric layer 124. A thickness of the core C may be determined by the Young's modulus or stiffness of the core dielectric layer 124, however the thickness of the core C is not limited thereto. For example, the core C with a higher stiffness may be thinner while still maintaining the stability of the structure. In other words, the core C with a higher Young's modulus than the dielectric layers in the interconnection structure is used to reinforce the mechanical stability of the package.

Figure 3A:
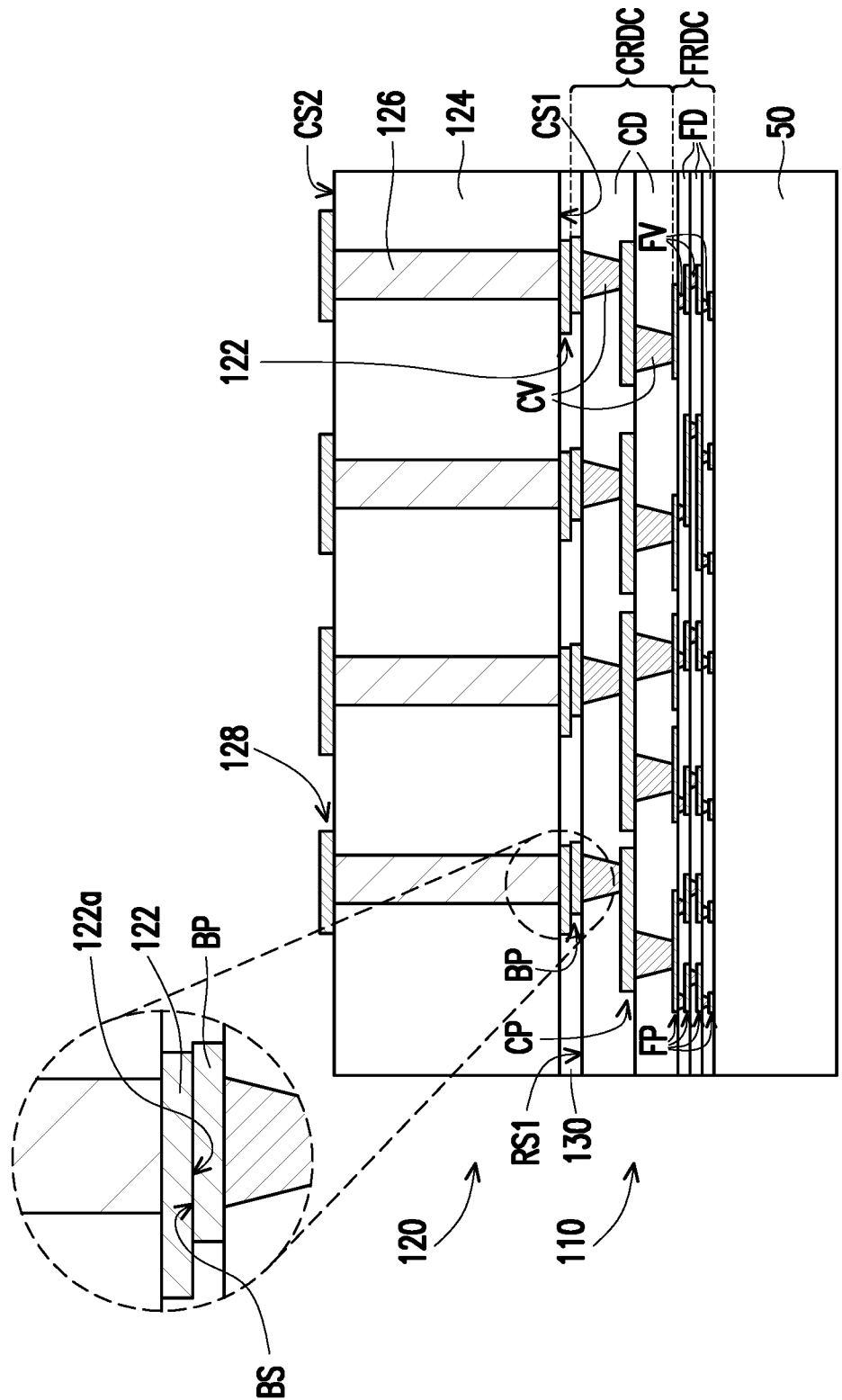
FIGS. 3A and 3B are schematic cross-sectional views illustrating a manufacturing method of a package substrate according to an embodiment of the invention.
Figure 3B:
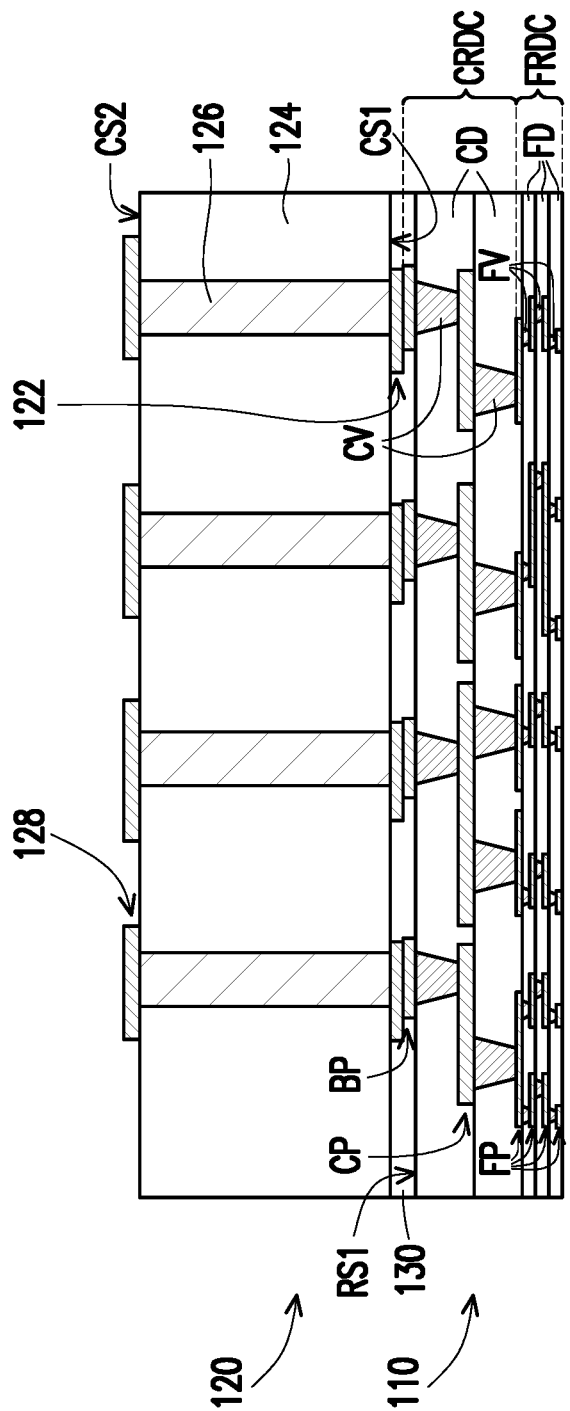
Figure 4:
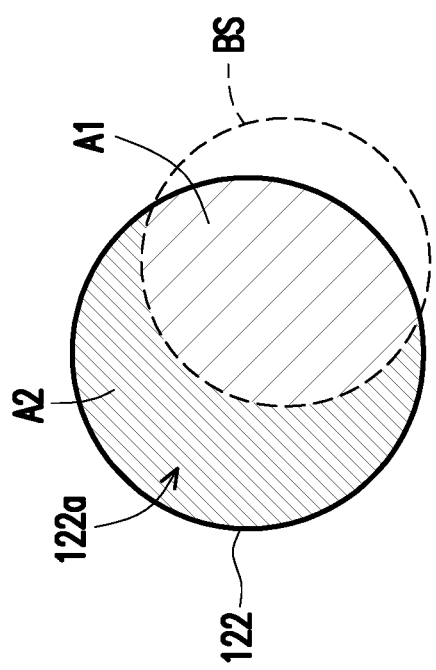
FIG. 4 is a schematic bottom view illustrating the relationship of the first core pad and the bonding pad in FIG. 3A according to an embodiment of the invention.

The following describes a manufacturing method of a package substrate with reference to FIGS. 3A and 3B. FIGS. 3A and 3B are schematic cross-sectional views illustrating a manufacturing method of a package substrate according to an embodiment of the invention and FIG. 4 is a schematic bottom view illustrating the relationship of the first core pad and the bonding pad in FIG. 3A according to an embodiment of the invention. Referring to FIG. 3A and FIG. 4, the core 120 is disposed on the redistribution structure 110. For example, the first core surface CS1 faces towards the first redistribution surface RS1 of the redistribution structure 110. For example, the redistribution structure 110 and the core 120 may be separately provided before bonding process. During bonding process, the temporary carrier 50 can serve as a support. The core 120 and the redistribution structure 110 may be directly bonded to each other without precisely alignment. For example, the first core pad 122 of the core 120 is directly bonded to the bonding pad BP of the redistribution structure 110 and the first core pad 122 is offset from the bonding pad BP. The first core pad 122 may be interleaved with an offset with respect to the bonding pad BP. For example, a centre of the first core pad 122 is laterally offset from a centre of the bonding pad BP in the cross-sectional view shown in FIG. 3A.

In some embodiments, the first core pad 122 has a facet 122a connecting to a portion of a bonding surface BS of the bonding pad BP. The facet 122a may have a first portion A1 and a second portion A2 connecting to the first portion A1. The first portion A1 may overlap the bonding surface BS and the second portion A2 may be exposed from the bonding surface BS as shown in FIG. 4. In other words, the first core pad 122 is offset in a direction away from the bonding pad BP such that the second portion A2 of the facet 122a is not in contact with the bonding pad BP. In some other embodiments, the facet 122a of the first core pad 122 connects to the entire bonding surface BS of the bonding pad BP. In such embodiments, the second portion A2 may surround the first portion A1. Since the first core pad 122 and the bonding pad BP can be offset therebetween without affecting the reliability of the electrical connection, it may reduce the level of dimensional tolerance which is required during manufacture of the package substrate so that manufacturing efforts and costs are reduced.

In some embodiments, a bonding layer 130 is disposed between the redistribution structure 110 and the core 120. For example, the bonding layer 130 may cover the bonding pad BP and the first core pad 122 for strengthening the attachment therebetween. In some embodiments, the bonding layer 130 may directly in contact with the second portion A2 which is not overlapped with the bonding pad BP.

Referring to FIG. 3B, after directly bonding the redistribution structure 110 and the core 120, the temporary carrier 50 may be removed. The manufacturing process of a package substrate 100 is then substantially complete. For example, the temporary carrier 50 may be removed from the fine redistribution circuitry FRDC by applying external energy between the fine redistribution circuitry FRDC and the temporary carrier 50 to peel off the release layer or by using other suitable processes to remove the temporary carrier 50. After removing the temporary carrier 50, the package substrate 100 includes the second core pad 128 and the fine conductive pattern FP for further electrical connection.

Figure 5:
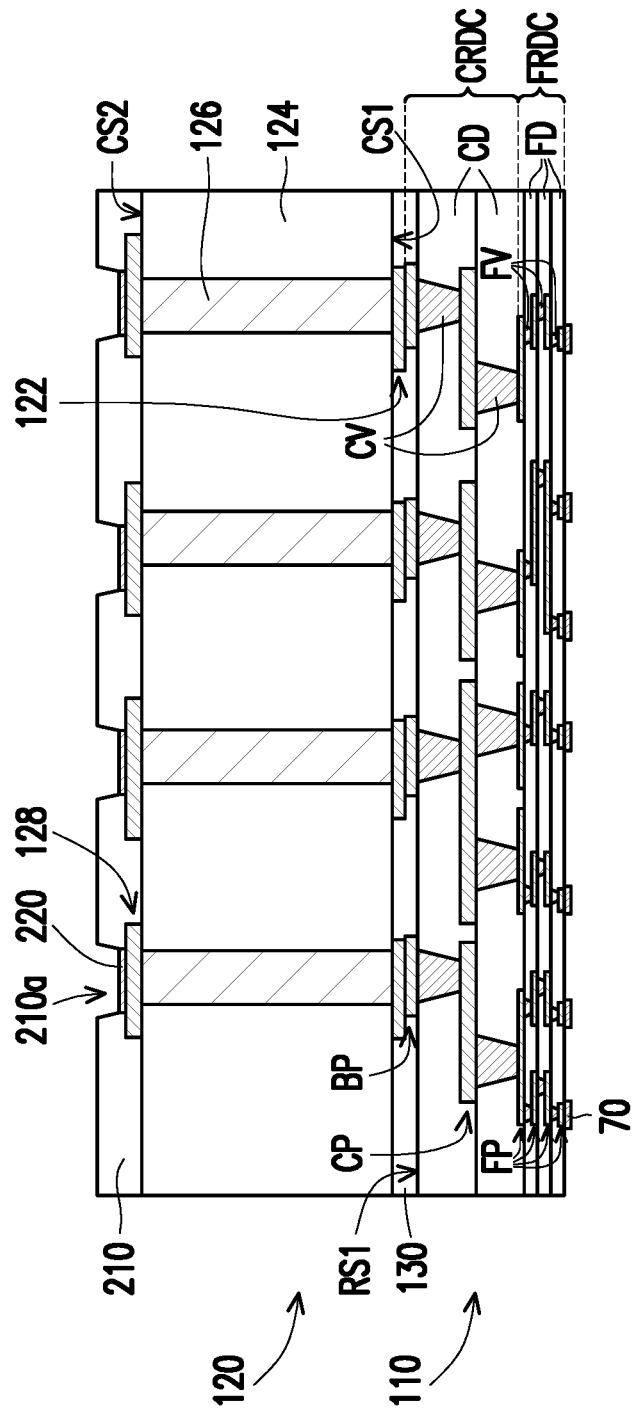
FIG. 5 is a schematic cross-sectional view illustrating a package substrate according to an embodiment of the invention.

FIG. 5 is a schematic cross-sectional view illustrating a package substrate according to an embodiment of the invention. Referring to FIG. 5, a package substrate 200 illustrated in FIG. 5 is similar to the package substrate 100 illustrated in FIG. 3B. Identical or similar numbers refer to identical or similar elements throughout the drawings, and already described detail thereof is not repeated here. The difference between the package substrate 100 and the package substrate 200 lies in that the package substrate 200 further includes a passivation layer 210 and a surface finishing layer 220. For example, the passivation layer 210 is disposed on the core dielectric layer 124 opposite to the redistribution structure 110. The passivation layer 210 may have an opening 210a exposing a portion of the second core pad 128. In some embodiments, the second core pad 128 is used for a ball mount. For example, the passivation layer 210 may be a solder mask, or may include inorganic materials or other suitable insulating materials.

The surface finishing layer 220 may be disposed in the opening 210a of the passivation layer 210 and on the portion of the second core pad 128 exposed by the opening 210a to inhibit oxidation. In some embodiments, the surface finishing layers 220 is disposed on the second core pad 128 for protection and solderability. In some other embodiments, after removing the temporary carrier 50, the fine conductive pattern FP is exposed and then the surface finishing layer 70 may be formed on the exposed fine conductive pattern FP to inhibit oxidation.

Figure 6:
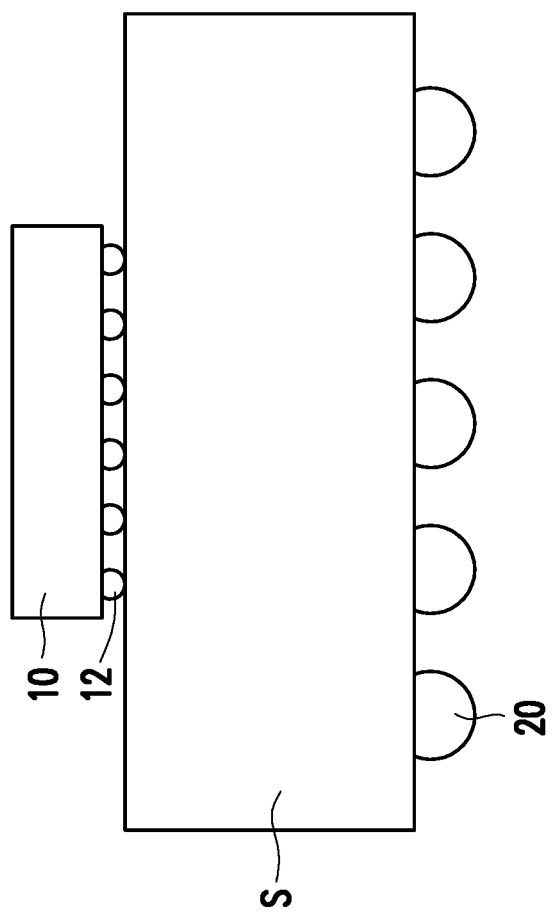
FIG. 6 is a schematic cross-sectional view illustrating a package structure according to an embodiment of the invention.

FIG. 6 is a schematic cross-sectional view illustrating a package structure according to an embodiment of the invention. Referring to FIG. 6, a package structure 300 includes a package substrate S and a semiconductor chip 10. For example, the semiconductor chip 10 is disposed on the redistribution structure 110 opposite to the core 120 and the semiconductor chip 10 is electrically connected to the core 120 through the redistribution structure 110.

For example, the portions of the outermost layer of the fine conductive pattern FP of fine redistribution circuitry FRDC connected to the semiconductor chip 10 are bump pads. For example, a plurality of conductive bumps 12 disposed on the active surface of the semiconductor chip 10 can be used to electrically connect the package substrate S to the semiconductor chip 10. In some embodiments, the package structure 300 may include at least one conductive terminal 20 disposed on the core 120 opposite to the semiconductor chip 10. The conductive terminals 20 may be electrically connected to the semiconductor chip 10 through the core 120 and the redistribution structure 110.

As semiconductor structures become more advanced, the need for higher input/output density leads to a tighter bump pitch. The fine redistribution circuitry FRDC of the package substrate S (e.g. the package substrate 100 shown in FIG. 3B or the package substrate 200 shown in FIG. 5.) meets the fine line and space requirements of such high bump density of flip chips. For example, the semiconductor chip 10 is disposed on the fine redistribution circuitry FRDC opposite to the core 120 using the flip-chip technique to electrically connect the fine redistribution circuitry FRDC to the semiconductor chip 10. In some embodiments, the fine redistribution circuitry FRDC and the coarse redistribution circuitry CRDC can be used for redistribution as well as for power/ground circuit distribution. The conductive terminals 20 may be disposed on the core 120 opposite to the semiconductor chip 10 and electrically connected to the semiconductor chip 10 through the core 120. As such, the package structure 300 has a short electrical conduction path from the semiconductor chip 10 to the conductive terminals 20 for better circuit performance.

Figure 7:
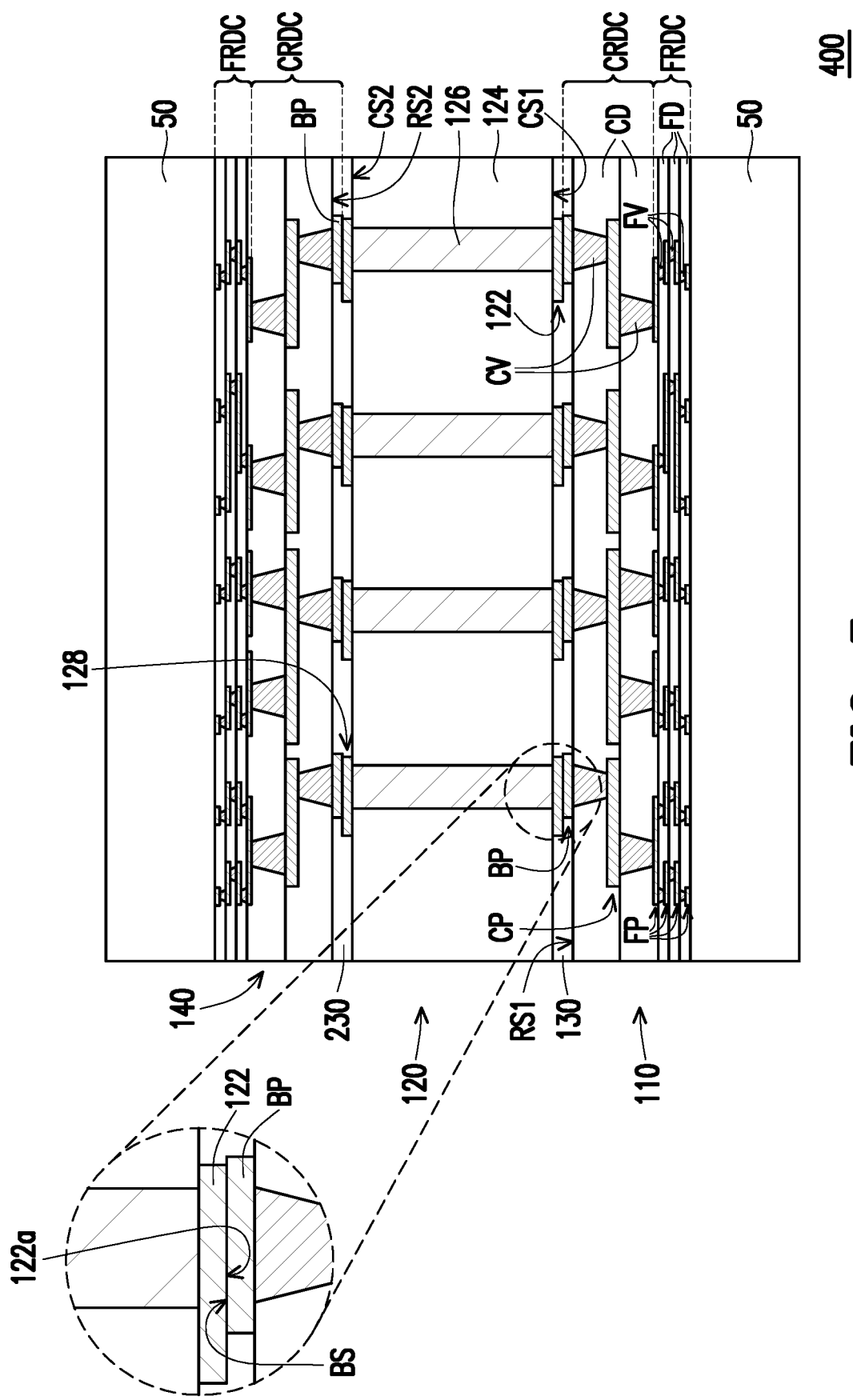
FIG. 7 is a schematic cross-sectional view illustrating a package substrate of an embodiment of the invention.

FIG. 7 is a schematic cross-sectional view illustrating a package substrate of an embodiment of the invention. In FIG. 3A and FIG. 7, like numerals denote like elements, and redundant descriptions may be omitted. Referring to FIG. 7, a package substrate 400 includes the redistribution structure 110 (as a first redistribution structure), the core 120 and a redistribution structure 140 (as a second redistribution structure). The redistribution structure 140 has a second redistribution surface RS2. The core 120 is disposed between the redistribution structure 110 and the redistribution structure 140. For example, the first core surface CS1 of the core 120 faces towards the first redistribution surface RS1 of the redistribution structure 110, and the second core surface CS2 of the core 120 faces towards the second redistribution surface RS2 of the redistribution structure 140.

Each of the redistribution structure 110 and the redistribution structure 140 comprises the fine redistribution circuitry FRDC and the coarse redistribution circuitry CRDC. The redistribution structure 140 and the core 120 of the package substrate 100 with or without the temporary carrier 50 (shown in FIGS. 3A-3B) may be separately provided before bonding process. The core 120 of the package substrate 100 with or without the temporary carrier 50 and the redistribution structure 140 may be directly bonded to each other without precisely alignment.

For example, the core 120 and the redistribution structure 140 may be directly bonded to each other without precisely alignment. For example, the second core pad 128 of the core 120 is directly bonded to the bonding pad BP of the redistribution structure 140 and the second core pad 128 is offset from the bonding pad BP. The second core pad 128 may be interleaved with an offset with respect to the bonding pad BP. For example, a centre of the second core pad 128 is laterally offset from a centre of the bonding pad BP in the cross-sectional view shown in FIG. 7.

In some embodiments, a bonding layer 230 is disposed between the redistribution structure 140 and the core 120. For example, the bonding layer 230 may cover the bonding pad BP and the second core pad 128 for strengthening the attachment therebetween. The property of the bonding layer 230 may be the same as the property of the bonding layer 130. Therefore, the like numerals denote like elements, and redundant descriptions may be omitted.

The redistribution structure 140 is electrically connected to the core 120 and the redistribution structure 110 by the bonding pad BP of the redistribution structure 140 in contact with the second core pad 128 of the core 120. The property of the redistribution structure 140 is the similar with the property of the redistribution structure 110 comprising the fine redistribution circuitry FRDC and the coarse redistribution circuitry CRDC. Therefore, the like numerals denote like elements, and redundant descriptions may be omitted.

After the temporary carriers 50 shown in FIG. 7 are removed, a semiconductor chip (such as the semiconductor chip 10 shown in FIG. 6) may be disposed on the redistribution structure 140 and the semiconductor chip is electrically connected to the core 120 through the redistribution structure 140. At least one conductive terminal (such as the conductive terminal 20 shown in FIG. 6) may be disposed on the redistribution structure 110. The conductive terminals 20 may be electrically connected to the semiconductor chip 10 through the redistribution structure 110, the core 120 and the redistribution structure 140.

Figure 8:
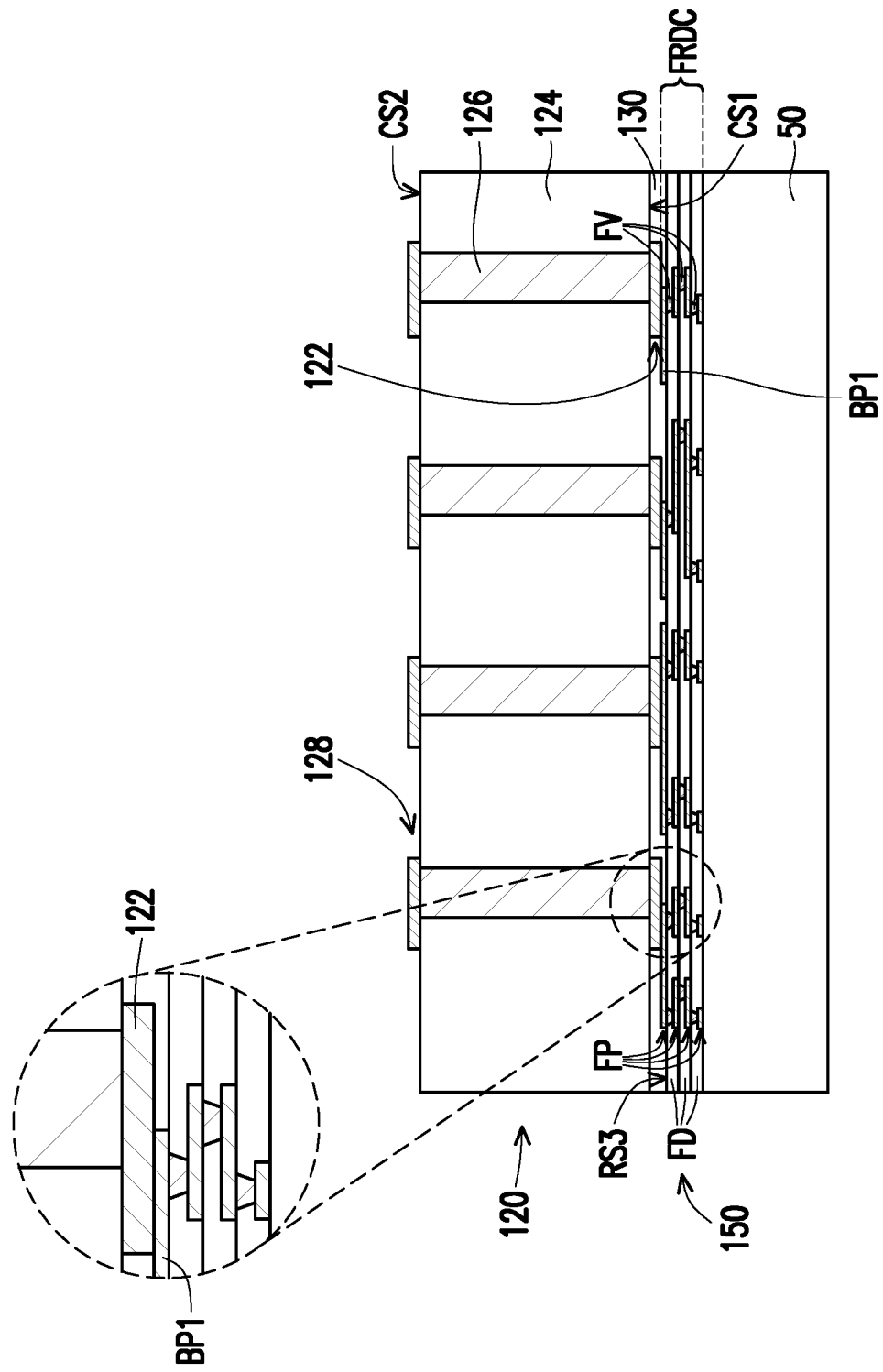
FIG. 8 is a schematic cross-sectional view illustrating a package substrate of an embodiment of the invention.

FIG. 8 is a schematic cross-sectional view illustrating a package substrate of an embodiment of the invention. In FIG. 3A and FIG. 8, like numerals denote like elements, and redundant descriptions may be omitted. Referring to FIG. 8, a package substrate 500 includes a structure of the package substrate 100 with the temporary carrier 50, except for the coarse redistribution circuitry CRDC. For example, the redistribution structure 150 comprises the fine redistribution circuitry FRDC. The redistribution structure 150 has a third redistribution surface RS3. For example, the first core surface CS1 of the core 120 faces towards the third redistribution surface RS3 of the redistribution structure 150. The core 120 and the redistribution structure 150 may be directly bonded to each other without precisely alignment. For example, the first core pad 122 of the core 120 is directly bonded to the bonding pad BP1 of the redistribution structure 150 and the first core pad 122 is offset from the bonding pad BP1. The first core pad 122 may be interleaved with an offset with respect to the bonding pad BP1. For example, a centre of the first core pad 122 is laterally offset from a centre of the bonding pad BP1 in the cross-sectional view shown in FIG. 8.

In some embodiments, a bonding layer 130 is disposed between the redistribution structure 150 and the core 120. For example, the bonding layer 130 may cover the bonding pad BP1 and the first core pad 122 for strengthening the attachment therebetween. In some embodiments, the bonding layer 130 may directly in contact with a portion of a facet of the first core pad 122 which is not overlapped with the bonding pad BP1.

Figure 9:
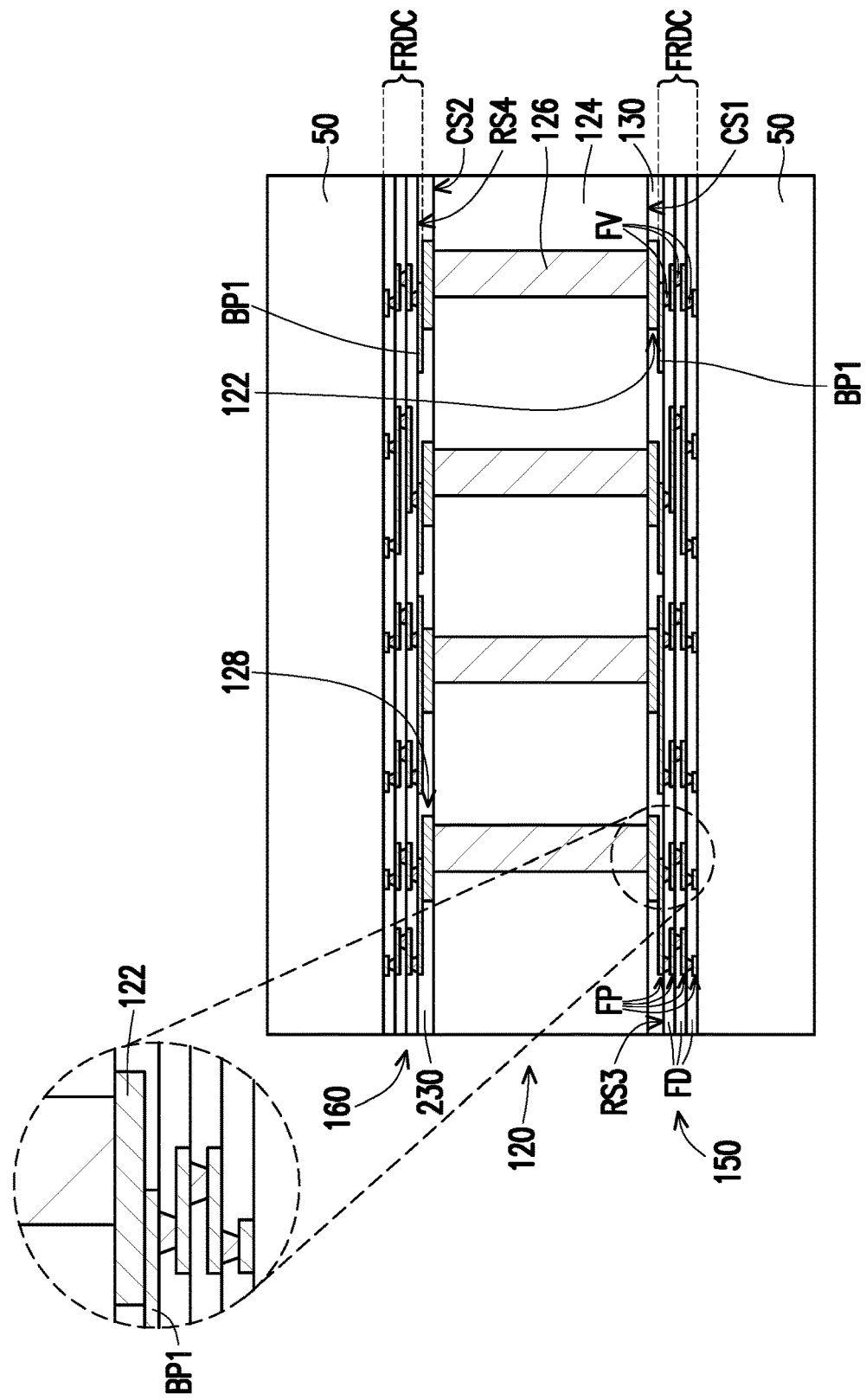
FIG. 9 is a schematic cross-sectional view illustrating a package substrate of an embodiment of the invention.

FIG. 9 is a schematic cross-sectional view illustrating a package substrate of an embodiment of the invention. In FIG. 3A and FIGS. 8-9, like numerals denote like elements, and redundant descriptions may be omitted. Referring to FIG. 9, a package substrate 600 includes the redistribution structure 150 (as a first redistribution structure), the core 120 and a redistribution structure 160 (as a second redistribution structure). The redistribution structure 160 has a fourth redistribution surface RS4. The core 120 is disposed between the redistribution structure 150 and the redistribution structure 160. For example, the first core surface CS1 of the core 120 faces towards the third redistribution surface RS3 of the redistribution structure 150, and the second core surface CS2 of the core 120 faces towards the fourth redistribution surface RS4 of the redistribution structure 160.

Each of the redistribution structure 150 and the redistribution structure 160 comprises the fine redistribution circuitry FRDC and the coarse redistribution circuitry CRDC. For example, the redistribution structure 160 and the core 120 of the package substrate 500 separately provided before bonding process. During bonding process, the temporary carriers 50 can serve as supports for the redistribution structure 150 and the redistribution structure 160. The core 120 of the package substrate 500 and the redistribution structure 160 may be directly bonded to each other without precisely alignment.

For example, the core 120 and the redistribution structure 160 may be directly bonded to each other without precisely alignment. For example, the second core pad 128 of the core 120 is directly bonded to the bonding pad BP1 of the redistribution structure 160 and the second core pad 128 is offset from the bonding pad BP1. The second core pad 128 may be interleaved with an offset with respect to the bonding pad BP1. For example, a centre of the second core pad 128 is laterally offset from a centre of the bonding pad BP1 in the cross-sectional view shown in FIG. 9.

In some embodiments, a bonding layer 230 is disposed between the redistribution structure 160 and the core 120. For example, the bonding layer 230 may cover the bonding pad BP1 and the second core pad 128 for strengthening the attachment therebetween. The property of the bonding layer 230 may be the same as the property of the bonding layer 130. Therefore, the like numerals denote like elements, and redundant descriptions may be omitted.

After the temporary carriers 50 shown in FIG. 9 are removed, a semiconductor chip (such as the semiconductor chip 10 shown in FIG. 6) may be disposed on the redistribution structure 160 and the semiconductor chip is electrically connected to the core 120 through the redistribution structure 160. At least one conductive terminal (such as the conductive terminal 20 shown in FIG. 6) may be disposed on the redistribution structure 150. The conductive terminals 20 may be electrically connected to the semiconductor chip 10 through the redistribution structure 150, the core 120 and the redistribution structure 160.

Further to that described above, the coarse redistribution circuitry directly is connected to the fine redistribution circuitry without the aid of foreign materials such as solders, thereby keeping the electrical conduction path through the package substrate short and achieving a robust electronic package interconnection structure for high quality electrical signal transmission. In addition, the core pad of the core is offset from the corresponding bonding pad of the redistribution structure, thereby reducing the level of dimensional tolerance which is required during manufacture of the package substrate so as to reduce manufacturing efforts and costs. Furthermore, the Young's modulus of the core is greater than the Young's modulus of the redistribution circuitry (e.g. the first, the second and the fine redistribution circuitry) to reinforce the mechanical stability of the package substrate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A package substrate comprising:
a first redistribution structure having a first redistribution surface and a first bonding pad disposed on the first redistribution surface;
a second redistribution structure having a second redistribution surface and a second bonding pad disposed on the second redistribution surface;
a core disposed between the first redistribution structure and the second redistribution structure, having a first core surface facing towards the first redistribution surface of the first redistribution structure, having a first core pad disposed on the first core surface, having a second core surface opposite to the first core surface facing towards the second redistribution surface of the second redistribution structure, and having a second core pad disposed on the second core surface;
a first bonding layer disposed between the first redistribution structure and the core, and covering the first bonding pad and the first core pad; and
a second bonding layer disposed between the second redistribution structure and the core, and covering the second bonding pad and the second core pad,
wherein a center of the first core pad is laterally offset from a center of the first bonding pad, a first portion of a planar surface of the first core pad is physically and directly contacting a planar surface of the first bonding pad, a second portion of the planar surface of the first core pad surrounding the first portion of the planar surface of the first core pad is non-bonded to the first bonding pad, and the first bonding pad and the first core pad are embedded in the first bonding layer,
wherein a center of the second core pad is laterally offset from a center of the second bonding pad, a first portion of a planar surface of the second core pad is physically and directly contacting a planar surface of the second bonding pad, a second portion of the planar surface of the second core pad surrounding the first portion of the planar surface of the second core pad is non-bonded to the second bonding pad, and the second bonding pad and the second core pad are embedded in the second bonding layer.

2. The package substrate according to claim 1, wherein a facet of the first core pad connects to a portion of a bonding surface of the first bonding pad or the entire bonding surface of the first bonding pad.

3. The package substrate according to claim 1, wherein a facet of the second core pad connects to a portion of a bonding surface of the second bonding pad or the entire bonding surface of the second bonding pad.

4. The package substrate according to claim 1, wherein the core comprises:
   a core dielectric layer, the first core pad and the second core pad respectively disposed on the two opposite surfaces of the core dielectric layer; and
   a conductive through via connected to the first core pad and the second core pad, and being through the core dielectric layer.

5. The package substrate according to claim 1, wherein the first redistribution structure comprises:
   a fine redistribution circuitry comprising a fine conductive pattern; and
   a coarse redistribution circuitry disposed on the fine redistribution circuitry and having the first bonding pad and a coarse conductive pattern electrically connected to the fine conductive pattern, wherein a thickness of the fine redistribution circuitry is less than a thickness of the coarse redistribution circuitry, and a dimension of the fine conductive pattern is less than a dimension of the coarse conductive pattern.

6. The package substrate according to claim 5, wherein the coarse redistribution circuitry comprises:
   a coarse dielectric layer, the coarse conductive pattern being stacked on the coarse dielectric layer; and
   a coarse conductive via connected among the fine conductive pattern, the coarse conductive pattern and the first bonding pad, the coarse conductive via is disposed in the coarse dielectric layer, wherein the coarse conductive via is tapered in a direction toward the fine redistribution circuitry.

7. The package substrate according to claim 6, wherein an outer diameter of one end of the coarse conductive via facing away from the fine redistribution circuitry is greater than an outer diameter of another end of the coarse conductive via facing toward the fine redistribution circuitry.

8. The package substrate according to claim 6, wherein the fine redistribution circuitry comprises a fine dielectric layer, the fine conductive pattern is stacked on the fine dielectric layer, and a thickness of the fine dielectric layer is less than a thickness of the coarse dielectric layer.

9. The package substrate according to claim 6, wherein the core comprises a core dielectric layer, a thickness of the coarse dielectric layer of the coarse redistribution circuitry is less than a thickness of the core dielectric layer and a Young's modulus of the core dielectric layer is greater than a Young's modulus of the coarse dielectric layer of the coarse redistribution circuitry.

10. The package substrate according to claim 1, wherein the second redistribution structure comprises:
    a fine redistribution circuitry comprising a fine conductive pattern; and
    a coarse redistribution circuitry disposed on the fine redistribution circuitry and having the second bonding pad and a coarse conductive pattern electrically connected to the fine conductive pattern, wherein a thickness of the fine redistribution circuitry is less than a thickness of the coarse redistribution circuitry, and a dimension of the fine conductive pattern is less than a dimension of the coarse conductive pattern.

11. The package substrate according to claim 10, wherein the coarse redistribution circuitry comprises:
    a coarse dielectric layer, the coarse conductive pattern being stacked on the coarse dielectric layer; and
    a coarse conductive via connected among the fine conductive pattern, the coarse conductive pattern and the second bonding pad, the coarse conductive via is disposed in the coarse dielectric layer, wherein the coarse conductive via is tapered in a direction toward the fine redistribution circuitry.

12. The package substrate according to claim 11, wherein an outer diameter of one end of the coarse conductive via facing away from the fine redistribution circuitry is greater than an outer diameter of another end of the coarse conductive via facing toward the fine redistribution circuitry.

13. The package substrate according to claim 11, wherein the fine redistribution circuitry comprises a fine dielectric layer, the fine conductive pattern is stacked on the fine dielectric layer, and a thickness of the fine dielectric layer is less than a thickness of the coarse dielectric layer.

14. The package substrate according to claim 11, wherein the core comprises a core dielectric layer, a thickness of the coarse dielectric layer of the coarse redistribution circuitry is less than a thickness of the core dielectric layer and a Young's modulus of the core dielectric layer is greater than a Young's modulus of the coarse dielectric layer of the coarse redistribution circuitry.

15. The package substrate according to claim 1, wherein the first redistribution structure comprises:
    a fine redistribution circuitry disposed on the first core surface of the core, and comprising a fine conductive pattern and a fine dielectric layer, wherein the fine conductive pattern is stacked on the fine dielectric layer and has the first bonding pad.

16. The package structure according to claim 15, further comprising:
    a conductive terminal disposed on the first redistribution structure, wherein the conductive terminal is electrically connected to the semiconductor chip through the first redistribution structure, the core and the second redistribution structure.

17. The package substrate according to claim 1, wherein the second redistribution structure comprises:
    a fine redistribution circuitry disposed on the second core surface of the core, and comprising a fine conductive pattern and a fine dielectric layer, wherein the fine conductive pattern is stacked on the fine dielectric layer and has the second bonding pad.

18. A package structure, comprising:
    a package substrate, the package substrate comprising:
        a first redistribution structure having a first redistribution surface and a first bonding pad disposed on the first redistribution surface;
        a second redistribution structure having a second redistribution surface and a second bonding pad disposed on the second redistribution surface;
        a core disposed between the first redistribution structure and the second redistribution structure, having a first core surface facing towards the first redistribution surface of the first redistribution structure, having a first core pad disposed on the first core surface, having a second core surface opposite to the first core surface facing towards the second redistribution surface of the second redistribution structure, and having a second core pad disposed on the second core surface;

a first bonding layer disposed between the first redistribution structure and the core, and covering the first bonding pad and the first core pad; and a second bonding layer disposed between the second redistribution structure and the core, and covering the second bonding pad and the second core pad, wherein a center of the first core pad is laterally offset from a center of the first bonding pad, a first portion of a planar surface of the first core pad is physically and directly contacting a planar surface of the first bonding pad, a second portion of the planar surface of the first core pad surrounding the first portion of the planar surface of the first core pad is non-bonded to the first bonding pad, and the first bonding pad and the first core pad are embedded in the first bonding layer, wherein a center of the second core pad is laterally offset from a center of the second bonding pad, a first portion of a planar surface of the second core pad is physically and directly contacting a planar surface of the second bonding pad, a second portion of the planar surface of the second core pad surrounding the first portion of the planar surface of the second core pad is non-bonded to the second bonding pad, and the second bonding pad and the second core pad are embedded in the second bonding layer; and a semiconductor chip disposed on the second redistribution structure, wherein the semiconductor chip is electrically connected to the core through the second redistribution structure.

19. A package substrate comprising:

a redistribution structure having a redistribution surface and a bonding pad disposed on the redistribution surface;

a core disposed on the redistribution structure, having a core surface facing towards the redistribution surface of the redistribution structure, and having a core pad disposed on the core surface; and a bonding layer disposed between the redistribution structure and the core, and covering the bonding pad and the core pad, wherein the core has a core pad disposed on the core surface, a center of the core pad is laterally offset from a center of the bonding pad, a first portion of a planar surface of the core pad is physically and directly contacting a planar surface of the bonding pad, a second portion of the planar surface of the core pad surrounding the first portion of the planar surface of the core pad is non-bonded to the bonding pad, and the bonding pad and the core pad are embedded in the bonding layer, wherein the redistribution structure comprises a fine redistribution circuitry disposed on the core surface of the core, the fine redistribution circuitry comprises a fine conductive pattern and a fine dielectric layer, and the fine conductive pattern is stacked on the fine dielectric layer and has the first bonding pad.

* * * * *